(12) United States Patent
Anand

(10) Patent No.: US 7,268,626 B2
(45) Date of Patent: Sep. 11, 2007

(54) COMPENSATING A POWER AMPLIFIER BASED ON OPERATIONAL-BASED CHANGES

(75) Inventor: Seema B. Anand, Beverly Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/836,873

(22) Filed: Apr. 30, 2004

(65) Prior Publication Data

US 2005/0242883 A1 Nov. 3, 2005

(51) Int. Cl.
*H03G 3/10* (2006.01)

(52) U.S. Cl. .................. 330/285; 330/296; 330/133

(58) Field of Classification Search .............. 330/2, 330/285, 4.5, 289, 272, 250, 277, 278, 129, 330/296, 133, 302, 279
See application file for complete search history.

(56) References Cited

U.S. PATENT DOCUMENTS

| | | | | |
|---|---|---|---|---|
| 5,942,946 | A * | 8/1999 | Su et al. ..................... | 330/310 |
| 6,215,358 | B1 * | 4/2001 | Hon et al. ................... | 330/289 |
| 6,232,834 | B1 * | 5/2001 | Zheng ......................... | 330/107 |
| 6,563,385 | B2 * | 5/2003 | Wojslaw ...................... | 330/296 |
| 6,605,999 | B2 * | 8/2003 | Matsushita et al. ......... | 330/285 |
| 6,642,784 | B2 * | 11/2003 | McMorrow .................. | 330/129 |
| 6,690,237 | B2 * | 2/2004 | Miyazawa .................... | 330/285 |
| 6,774,724 | B2 * | 8/2004 | Krvavac ....................... | 330/296 |
| 6,784,738 | B1 * | 8/2004 | Jin et al. ..................... | 330/263 |
| 6,819,180 | B2 * | 11/2004 | Krvavac ....................... | 330/285 |
| 2002/0163381 | A1 * | 11/2002 | Burt et al. ..................... | 330/2 |
| 2003/0201834 | A1 * | 10/2003 | Pehlke ......................... | 330/296 |
| 2004/0056720 | A1 * | 3/2004 | Jansen et al. ................ | 330/279 |
| 2004/0246048 | A1 * | 12/2004 | Leyonhjelm et al. .......... | 330/2 |

\* cited by examiner

*Primary Examiner*—Linh V. Nguyen
(74) *Attorney, Agent, or Firm*—Garlick Harrison & Markison; Timothy W. Markison

(57) ABSTRACT

A method for compensating a power amplifier based on operational-based changes begins by measuring one of a plurality of operational parameters of the power amplifier to produce a measured operational parameter. The method continues by comparing the measured operational parameter with a corresponding one of a plurality of desired operational parameter settings. The method continues by, when the comparing of the measured operational parameter with the corresponding one of a plurality of desired operational parameter settings is unfavorable, determining a difference between the measured operational parameter and the corresponding one of a plurality of desired operational parameter settings. The method continues by calibrating the one of the plurality of operational settings based on the difference.

20 Claims, 9 Drawing Sheets power amplifier 84 power amplifier 84 power amplifier 84 power amplifier 84 power amplifier 84 power amplifier 84

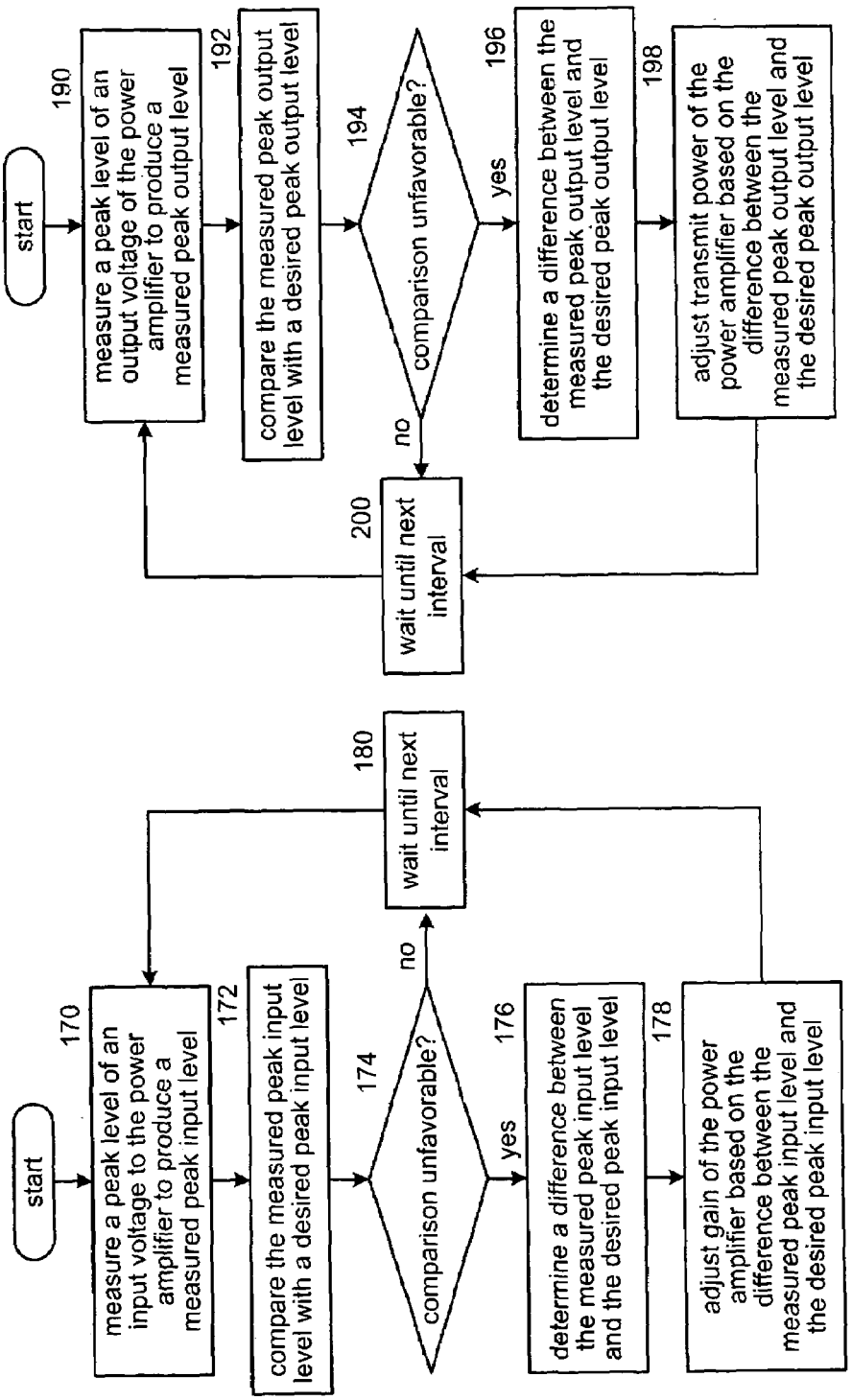

COMPENSATING A POWER AMPLIFIER BASED ON OPERATIONAL-BASED CHANGES

BACKGROUND OF THE INVENTION

1. Technical Field of the Invention

This invention relates generally to wireless communication systems and more particularly to power amplifiers of wireless transmitters.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is further known, it is desirable for the power amplifier to be linear over its operating range (i.e., have the same amplification properties over temperature, process variation, and transmit power levels). To achieve linearity of the power amplifier, it has been designed based on worst case operating conditions. While this achieves the goal of a linear power amplifier, typically, the power amplifier is over-designed. As a result of being over-designed, the power amplifier requires more current to function and thus consumes more power than is typically required. Such an increase in power consumption results in an increase in die area and cost.

Therefore, a need exists for an adjustable power amplifier having its operation at least partially dependent on operational conditions such that the adjustable power amplifier consumes less power.

BRIEF SUMMARY OF THE INVENTION

The compensating of a power amplifier based on operational based changes of the present invention substantially meets these needs and others. In one embodiment, a method for compensating a power amplifier based on operational-based changes begins by measuring one of a plurality of operational parameters of the power amplifier to produce a measured operational parameter. The method continues by comparing the measured operational parameter with a corresponding one of a plurality of desired operational parameter settings. The method continues by, when the comparing of the measured operational parameter with the corresponding one of a plurality of desired operational parameter settings is unfavorable, determining a difference between the measured operational parameter and the corresponding one of a plurality of desired operational parameter settings. The method continues by calibrating the one of the plurality of operational settings based on the difference.

In another embodiment, an adjustable power amplifier includes an adjustable input capacitor section, an adjustable input transistor section, an inductor, an adjustable bias voltage circuit, and a calibration module. The adjustable input capacitor section includes an input connection, an output connection, and a ground connection, wherein the input connection of the adjustable input capacitor section is operably coupled to receive an input radio frequency (RF) signal and the ground connection of the adjustable input capacitor section is operably coupled to a circuit ground. The adjustable input transistor section includes an input connection, an output connection, and a source connection, wherein the input connection of the adjustable input transistor second is operably coupled to the output connection of the adjustable input capacitor section and the source connection of the adjustable input transistor section is operably coupled to the circuit ground. The inductor includes a first node and a second node, wherein the first node of the inductor is operably coupled to a power supply and the second node of the inductor is operably coupled to the output connection of the adjustable input transistor section to provide an output of the adjustable power amplifier. The adjustable bias voltage circuit is operably coupled to provide a bias voltage to the input connection of the adjustable input transistor section. The calibration module is operably coupled to: measure one of a plurality of operational parameters of the power amplifier to produce a measured operational parameter; compare the measured operational parameter with a corresponding one of a plurality of desired operational parameter settings; when the comparing of the measured operational parameter with the corresponding one of a plurality of desired operational parameter settings is unfavorable, determine a difference between the measured operational parameter and the corresponding one of a plurality of desired operational parameter settings; and calibrate at least one of the adjustable input capacitor section, the adjustable input transistor section, and the adjustable bias voltage circuit based on the difference.

BRIEF DESCRIPTION OF THE SEVERAL VIEWS OF THE DRAWINGS

FIG. 10 is a logic diagram of a method for compensation a power amplifier based on another particular operational condition in accordance with the present invention; and FIG. 11 is a logic diagram of a method for compensation a power amplifier based on yet another particular operational condition in accordance with the present invention.

DETAILED DESCRIPTION OF THE INVENTION

Figure 1:
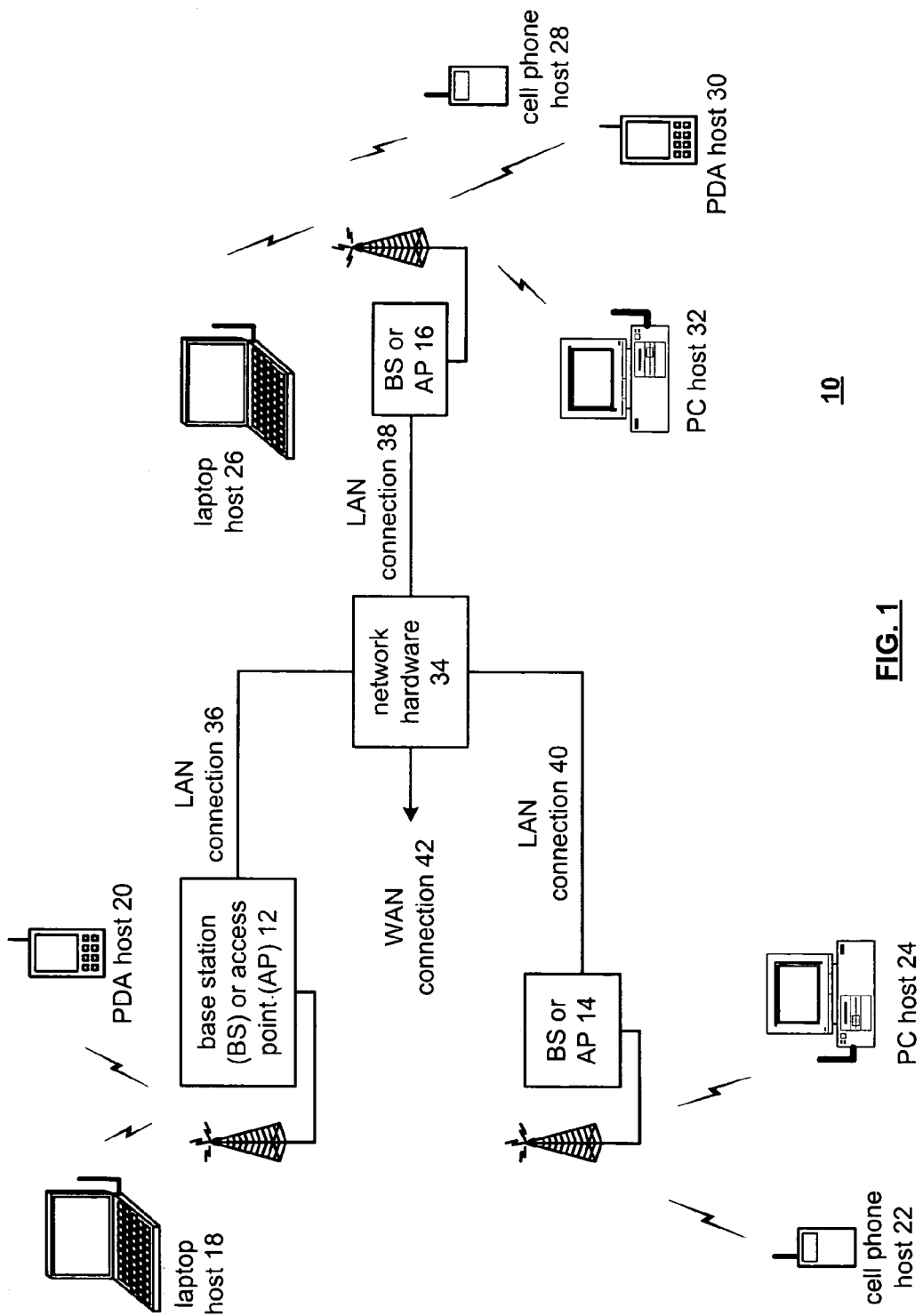
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
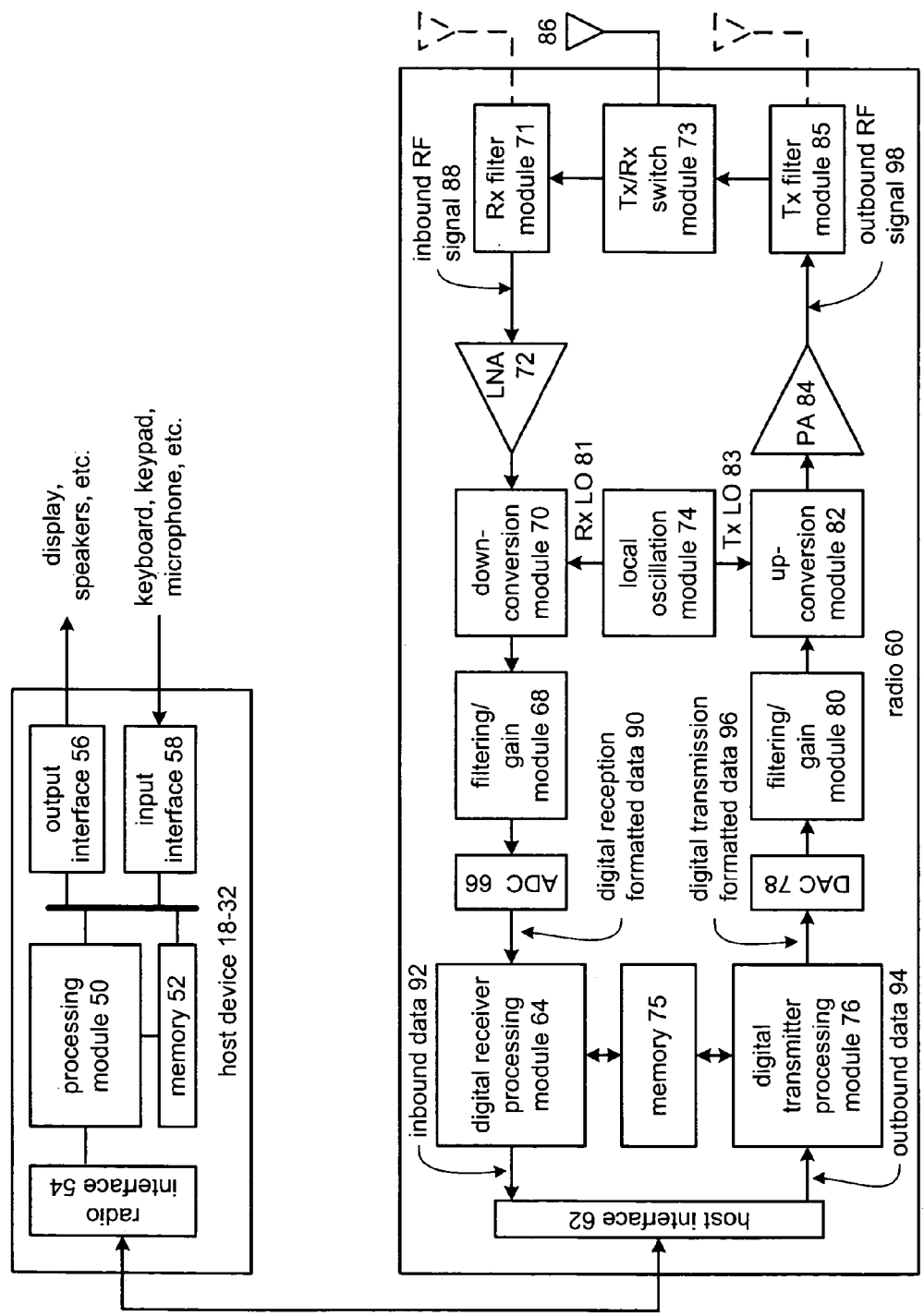
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84, which will be described in greater detail with reference to FIGS. 3-11, amplifies the RF signal to produce outbound RF signal 98. The transmitter filter module 85 filters the outbound RF signal 98 before the antenna 86 transmits it to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
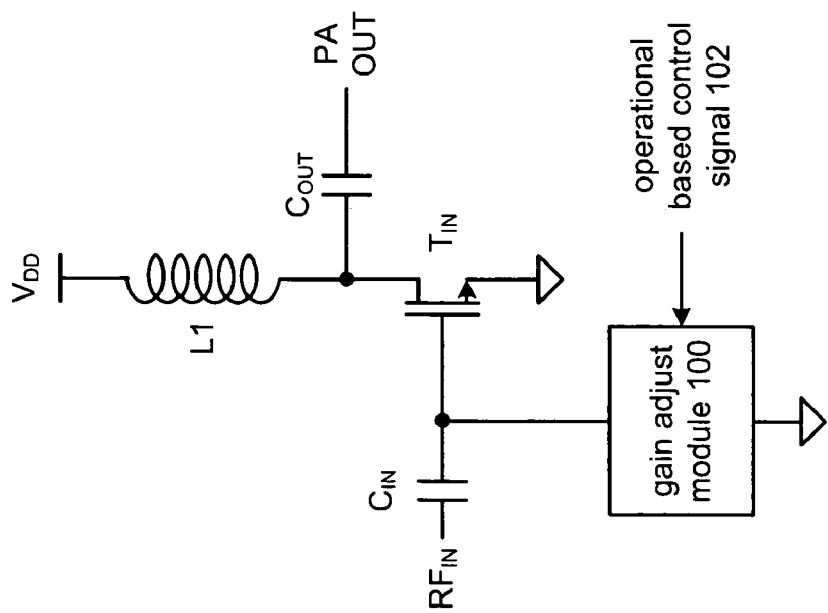
FIG. 3 is a schematic block diagram of an adjustable power amplifier in accordance with the present invention.

FIG. 3 is a schematic block diagram of an adjustable power amplifier 84 that includes an input capacitor ($C_{IN}$), an adjustable gain module 100, an input transistor ($T_{IN}$), an inductor ($L_1$), and an output capacitor ($C_{OUT}$). The power amplifier 84 is illustrated as a single-ended amplifier but could be readily modified to be a differential power amplifier by including a mirror image of the circuitry of the power amplifier 84 of FIG. 3.

As configured, the input capacitor $C_{IN}$ provides AC coupling of the RF input signal to the gate of the input transistor $T_{IN}$. The gain adjust module 100, based on an operational based control signal 102, adjusts the AC coupled RF signal to maintain linearization of the power amplifier 84. In one embodiment, the gain adjust module 100 is a variable capacitor that provides one of a plurality of capacitance values in response to a corresponding one of a plurality of values of operational based control signals. The operational based control signals may be determined based on at least one of process variations, temperature variations and/or output power variations. The determination of such operational based control signals will be further described with reference to FIGS. 7-11.

The input transistor $T_{IN}$ amplifies the adjusted input RF signal and produces an output of the power amplifier in conjunction with the inductor $L_1$ and the output capacitor $C_{OUT}$. The component values of the input capacitor, the input transistor, the inductor, and the output capacitor are dependent on the desired output power level of the power amplifier and on the frequency range of the RF input signals. In one embodiment, the frequency of the RF input signals may be in the 2.4 GHz range and/or the 5 GHz range, where the inductance of the inductor $L_1$ may range from fractions of nano Henries to tens of nano Henries, and the capacitance of the input capacitor and output capacitor may range from fractions of pico-Farads to tens of pico-Farads.

Figure 4:
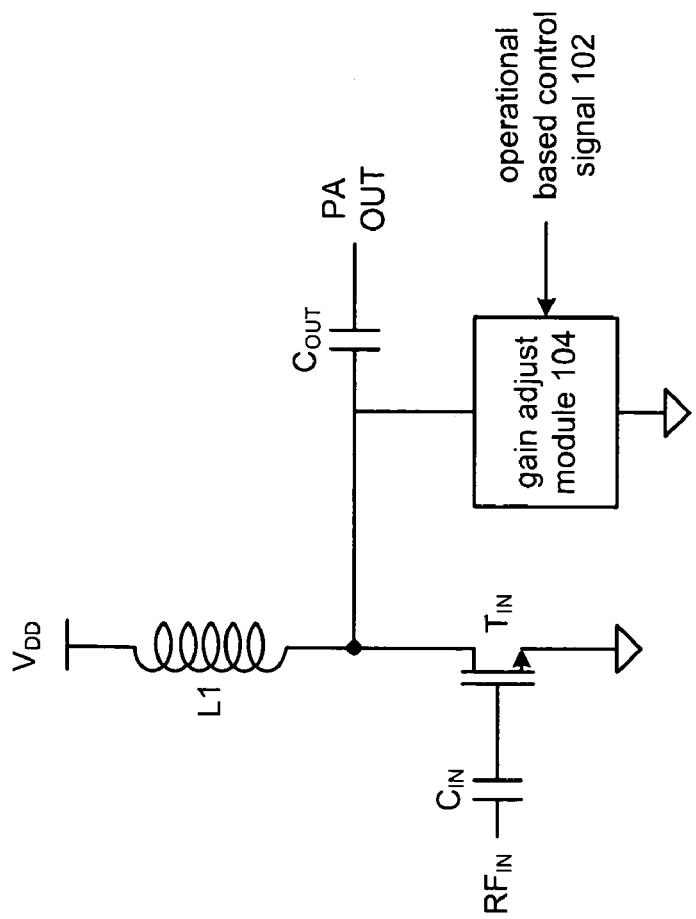
FIG. 4 is a schematic block diagram of another adjustable power amplifier in accordance with the present invention.

FIG. 4 is a schematic block diagram of another adjustable power amplifier 84. In this embodiment, the adjustable power amplifier 84 includes the input capacitor $C_{IN}$, the input transistor $T_{IN}$, the inductor $L_1$, the output capacitor $C_{OUT}$, and a gain adjust module 104. The power amplifier 84 is illustrated as a single-ended amplifier but could be readily modified to be a differential power amplifier by including a mirror image of the circuitry of the power amplifier 84 of FIG. 4.

As configured, the input capacitor $C_{IN}$ AC couples the RF input signals to the gate of the input transistor $T_{IN}$ without attenuation as in the embodiment of FIG. 3. The input transistor $T_{IN}$ amplifies the AC coupled RF input signals based on the inductance of the inductor L1 and on a setting of the gain adjust module 104. The amplified RF signals are AC coupled via the output capacitor $C_{OUT}$ to provide an output of the power amplifier 84. In one embodiment, the adjustable gain module 104 may be a variable capacitor circuit that provides one of a plurality of capacitance values in response to a corresponding one of a plurality of values of the operational based control signal. The operational based control signal may be determined from at least one of processed variations, temperature variations and output power variations. The determination of the operational based control signal will be described in greater detail with reference to FIGS. 7-11.

Figure 5:
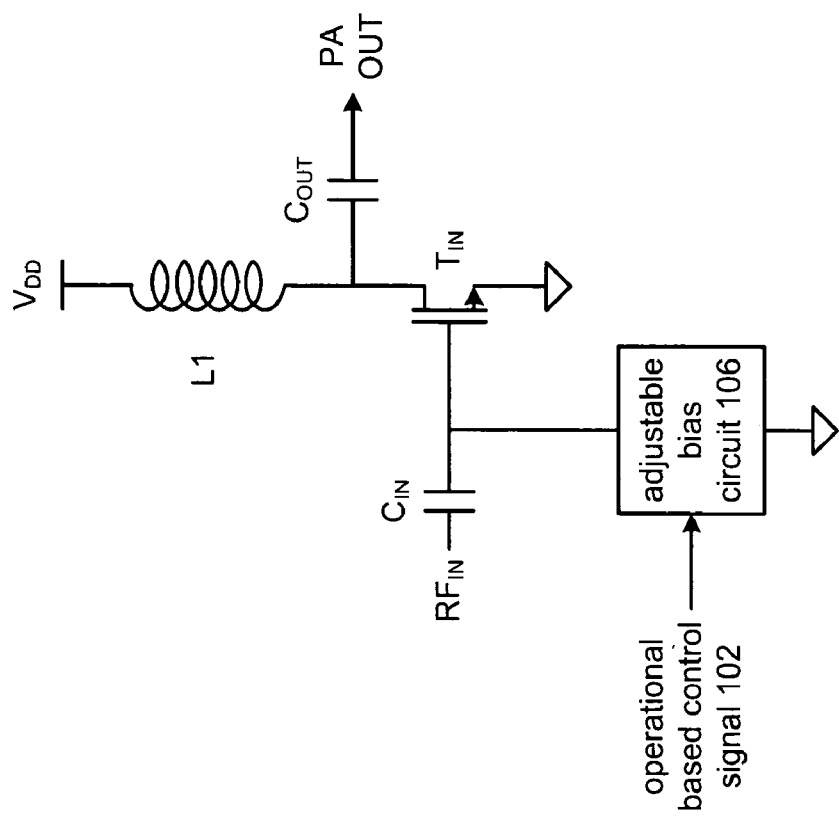
FIG. 5 is a schematic block diagram of yet another adjustable power amplifier in accordance with the present invention.

FIG. 5 is a schematic block diagram of another embodiment of an adjustable power amplifier 84. The power amplifier 84 is illustrated as a single-ended amplifier but could be readily modified to be a differential power amplifier by including a mirror image of the circuitry of the power amplifier 84 of FIG. 5.

In this embodiment, the power amplifier 84 includes the input capacitor $C_{IN}$, the input transistor $T_{IN}$, the inductor L1, and the output capacitor $C_{OUT}$, and an adjustable bias circuit 106. The input capacitor $C_{IN}$ AC couples the input RF signals to the input transistor $T_{IN}$. The adjustable bias circuit 106 adjusts the bias level of the input transistor based on an operational based control signal 102 to maintain linearity of the power amplifier as output power level requirements change, the operating temperature changes, and/or process variations of the components of the power amplifier 84. The operational based control signal 102 will be further described with reference to FIGS. 7-11.

The input transistor $T_{IN}$ in combination with the inductor L1 amplify the AC coupled input RF signals to produce amplified RF signals. The output capacitor $C_{OUT}$ AC couples the amplified RF signals to provide an output of the power amplifier 84.

As one of average skill in the art will appreciate, a power amplifier may be constructed to include one or more of the adjustable bias circuit 106, the gain adjust module 100, and/or the gain adjust module 104. As one of average skill in the art will further appreciate, the component sizes of the power amplifiers of FIGS. 3-7 may be in accordance with the example provided with the discussion of FIG. 3.

Figure 6:
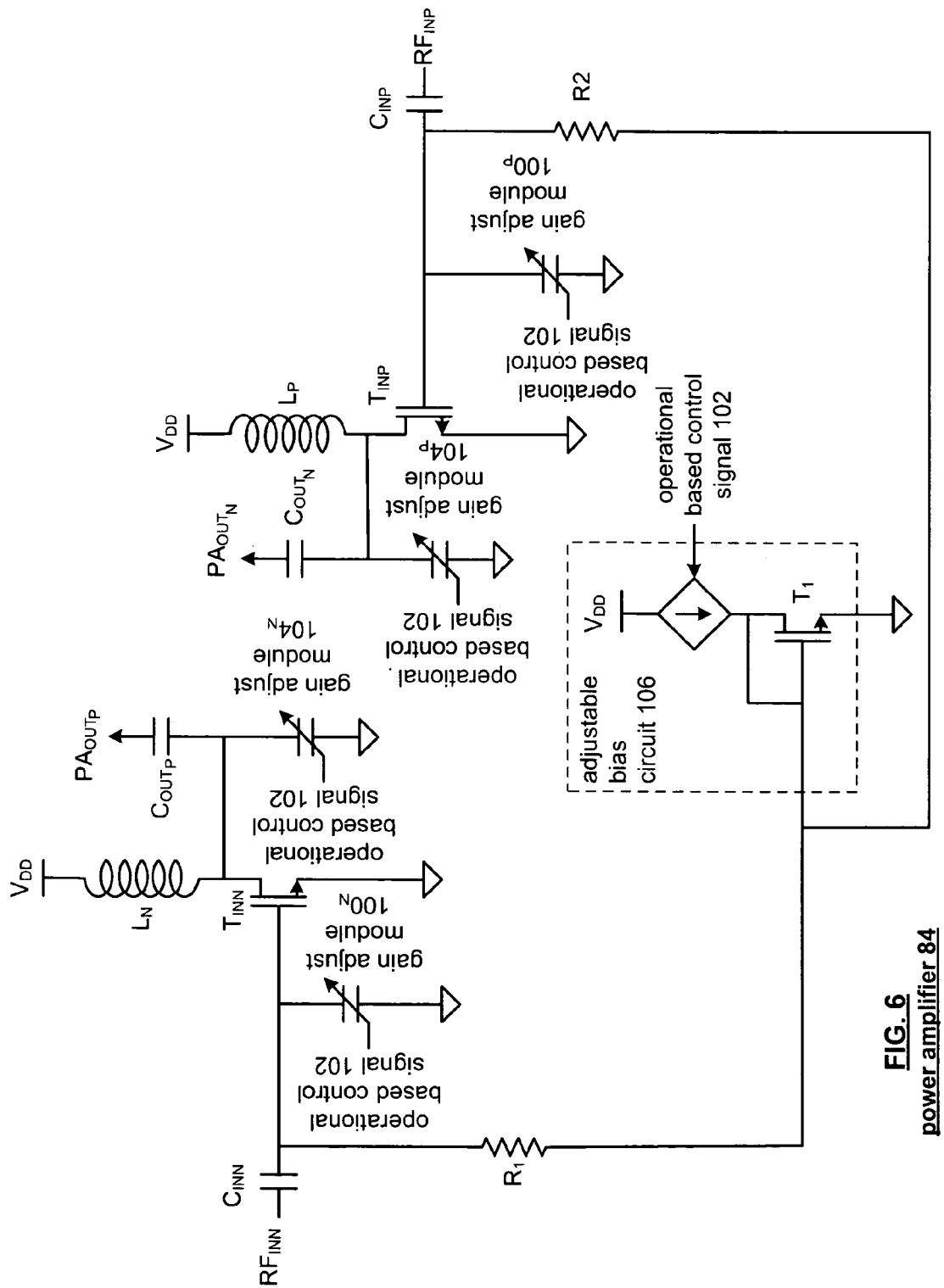
FIG. 6 is a schematic block diagram of a still another adjustable power amplifier in accordance with the present invention.

FIG. 6 is a schematic block diagram of yet another embodiment of an adjustable power amplifier 84. In this embodiment, the power amplifier 84 is a differential circuit and includes two input capacitors ($C_{INN}$ and $C_{INP}$), two input transistors ($T_{INN}$ and $T_{INP}$), two inductors ($L_N$ and $L_P$), two output capacitors ($C_{OUTP}$ and $C_{OUTN}$), two input variable capacitors $100_N$ and $100_P$, two output adjustable capacitors $104_N$ and $104_P$ and a bias adjust circuit 106. The bias adjust circuit 106 includes a dependent current source and a transistor $T_1$.

In operation, the input capacitors receive differential input RF signals. The variable capacitors 100N and 100P divide the voltage level of the differential input RF signals based on the capacitance level set by the operational based control signal 102 with respect to the capacitance of the input capacitors. The capacitor divided differential input RF signals are provided to the gates of the input transistors.

The bias circuit 106 establishes the bias voltage for the input transistors based on operational changes (e.g., temperature variations, power requirement changes, and/or process variations) by receiving the operational based control signal 102 vias the dependent current source. The dependent current source produces a corresponding current that is provided to transistor T1. As coupled, transistor T1 produces a reference bias voltage that is coupled to the gates of the input transistors via resistors R1 and R2.

The input transistors, the inductors, and the variable capacitors 104N and 104P amplify the capacitor divided RF input signals to produces amplified RF signals. The output capacitors provide the amplified RF signals as the output of the power amplifier. Note that the capacitance level of the variable capacitors is set based on the operational based control signal 102.

As one of average skill in the art will appreciate, the power amplifier 84 of FIG. 6 may be implemented with one, two, or three of the adjust modules 100, 104, and 106. For instance, the variable capacitors 104N and 104P may be omitted.

Figure 7:
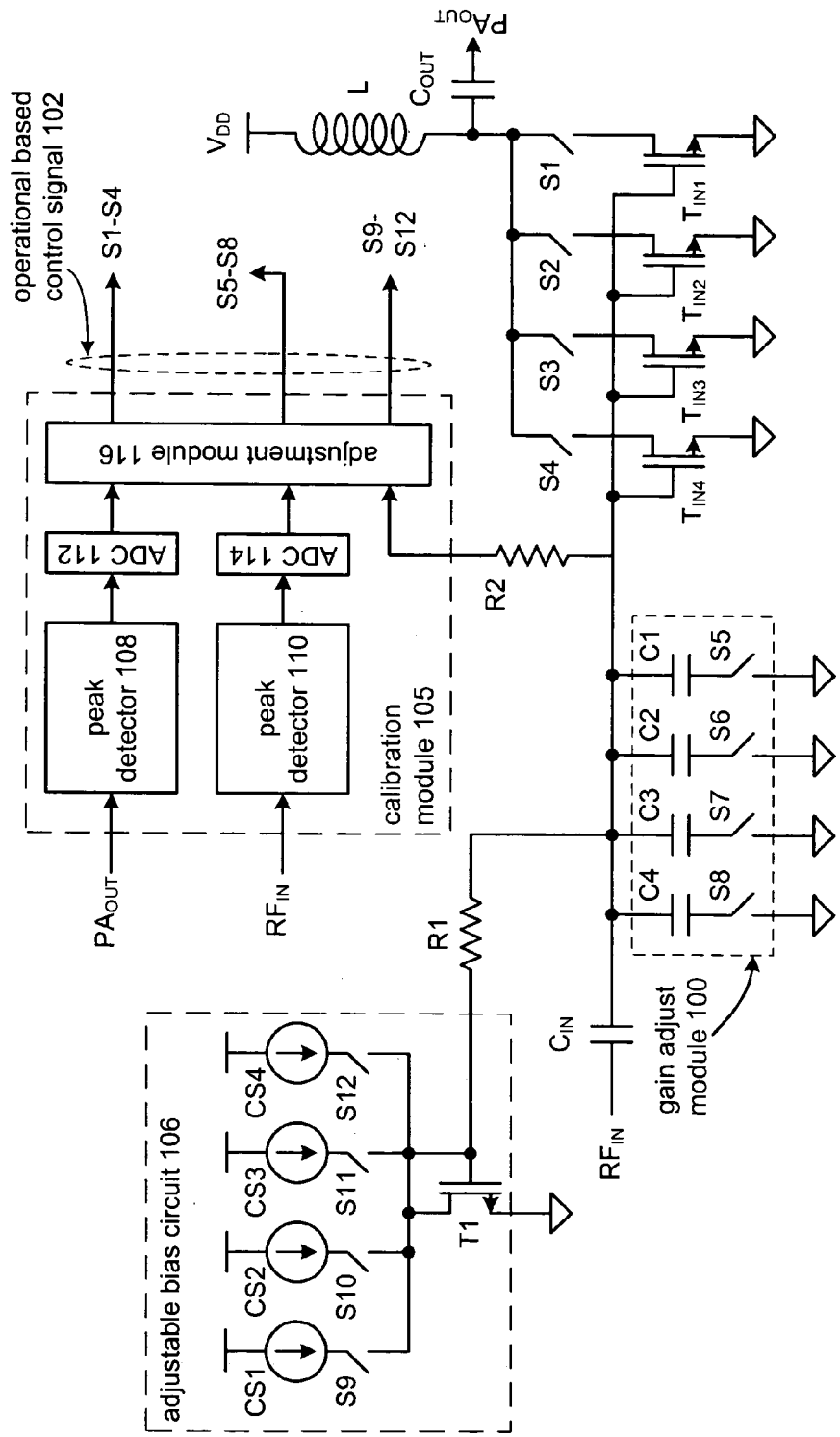
FIG. 7 is a schematic block diagram of even another adjustable power amplifier in accordance with the present invention.

FIG. 7 is a schematic block diagram of yet another embodiment of an adjustable power amplifier 84. In this embodiment, the single-ended power amplifier 84 includes a plurality of input transistors ($T_{IN1}$-$T_{IN4}$), input capacitor $C_{IN}$, inductor L, the gain adjust module 100, a calibration module 105, the bias circuit 106, and output capacitor $C_{OUT}$. As shown, the gain adjust module 100 includes a plurality of capacitors C1-C4 coupled in series with a plurality of switches S5-S8. The bias adjust circuit 106 includes a plurality of current sources CS1-CS4 coupled in series with a plurality of switches S9-S12 to produce a bias voltage via transistor $T_1$. The calibration module 105 includes a peak detectors 108 and 110, analog-to-digital converters 112 and 114, and an adjustment module 116.

In operation, the calibration adjust module 105 monitors the peak level of the output of the power amplifier, the peak level of the input of the power amplifier and the bias level of the input transistors $T_{IN1}$-$T_{IN4}$. The calibration module 105 monitors the output of the power amplifier ($PA_{OUT}$) via peak detector 108 to produce a peak voltage. The peak output voltage is converted to a digital signal via the analog-to-digital converter 112, which is provided to the adjustment module 116. The adjustment module 116, which performs one or more of the functions of FIGS. 8-11, determines the operational based control signal 102 by comparing the measured peak output power level with a desired peak output power level. Based on this comparison, the adjustment module 116 generates the operational based control signal 102 to enable one or more of switches 1-4 such that the desired output power level is more closely achieved.

The calibration module 105 monitors the input peak levels via peak detector 110, which produces an analog peak signal value that is converted to a digital value via the analog-to-digital converter 114. The adjustment module 116, performing one or more of the functions of FIGS. 8-11, determines the operational base control signal 102 for the gain adjust module 100 by comparing the digital peak input voltage with a desired input peak voltage. In this embodiment, the operational based control signal 102 enables one or more of switches S5-S8 to adjust the voltage level of the input RF signals.

The calibration module 105 further monitors the input bias level of the input transistors via resistor R2. When the bias level is different than a desired bias level, the adjustment module 116 produces the operational control based signal 102 for the bias adjust circuit 106. In one embodiment, the control signal 102 may enable one or more of switches S9-S12.

As one of average skill in the art will appreciate, switches S1-S12 may be implemented using transistors. As one of average skill in the art will further appreciate, a differential implementation of a power amplifier may be achieved by utilizing a mirror image of the circuit of FIG. 7.

Figure 8:
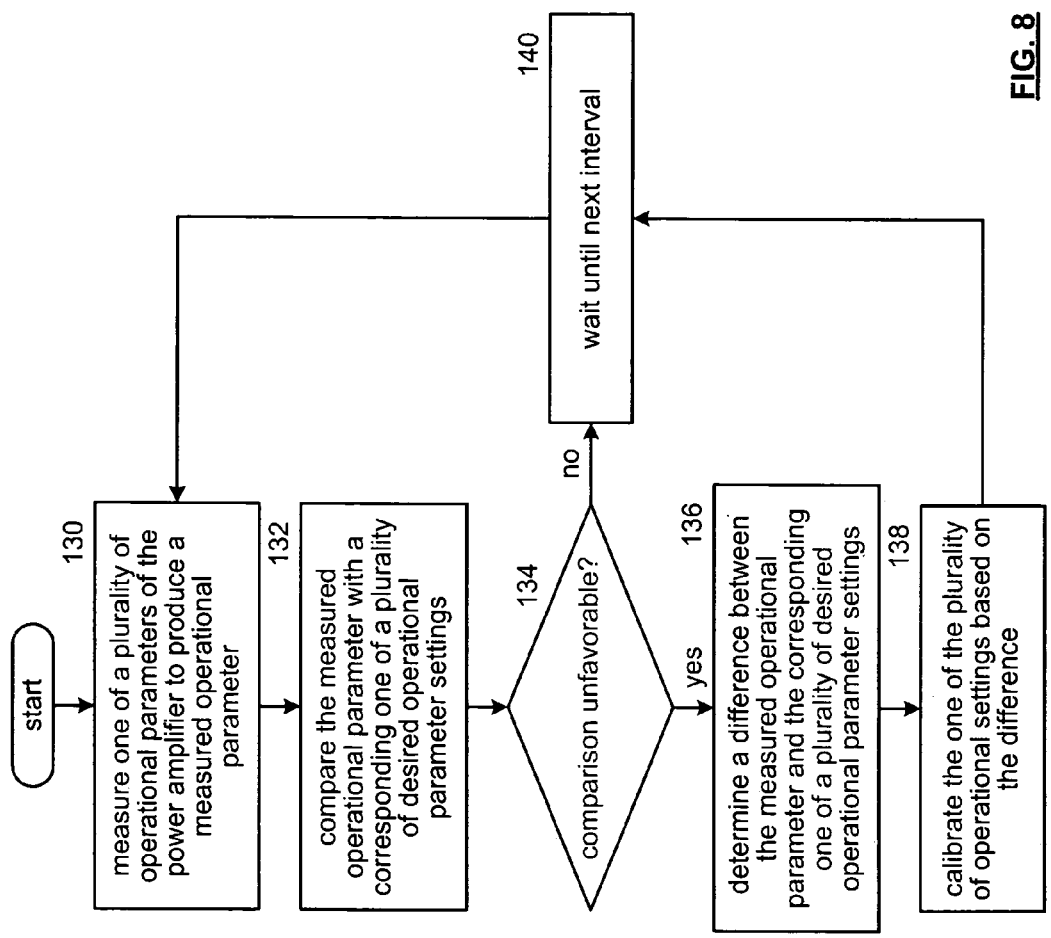
FIG. 8 is a logic diagram of a method for compensation a power amplifier based on operational based changes in accordance with the present invention.

FIG. 8 is a logic diagram of a method for compensating a power amplifier based on operational-based changes that begins at step 130 where a calibration module, which may be imbedded within one of the processing modules 64 and 76, measures one of a plurality of operational parameters of the power amplifier to produce a measured operational parameter. In one embodiment, the plurality of operational parameters includes gate-source voltage of at least one input transistor, peak input voltage of the power amplifier, and peak output voltage of the power amplifier. The method continues at step 132 the calibration module compares the measured operational parameter with a corresponding one of a plurality of desired operational parameter settings. This may be done as will be further described in FIGS. 9-11.

The method continues at step 134 where the method branches depending on whether the comparison was favorable. If the comparison is favorable, the method proceeds to step 140, where the method waits for a next interval of measurement. Note that the measurement intervals may be periodic (e.g., every 1-10 seconds) or randomly (e.g., when the transmitter is idle).

If the comparison at step 134 was not favorable, the method proceeds to step 136 where the calibration module determines a difference between the measured operational parameter and the corresponding one of a plurality of desired operational parameter settings. The method then proceeds to step 138 where the calibration module calibrates the one of the plurality of operational settings based on the difference.

Figure 9:
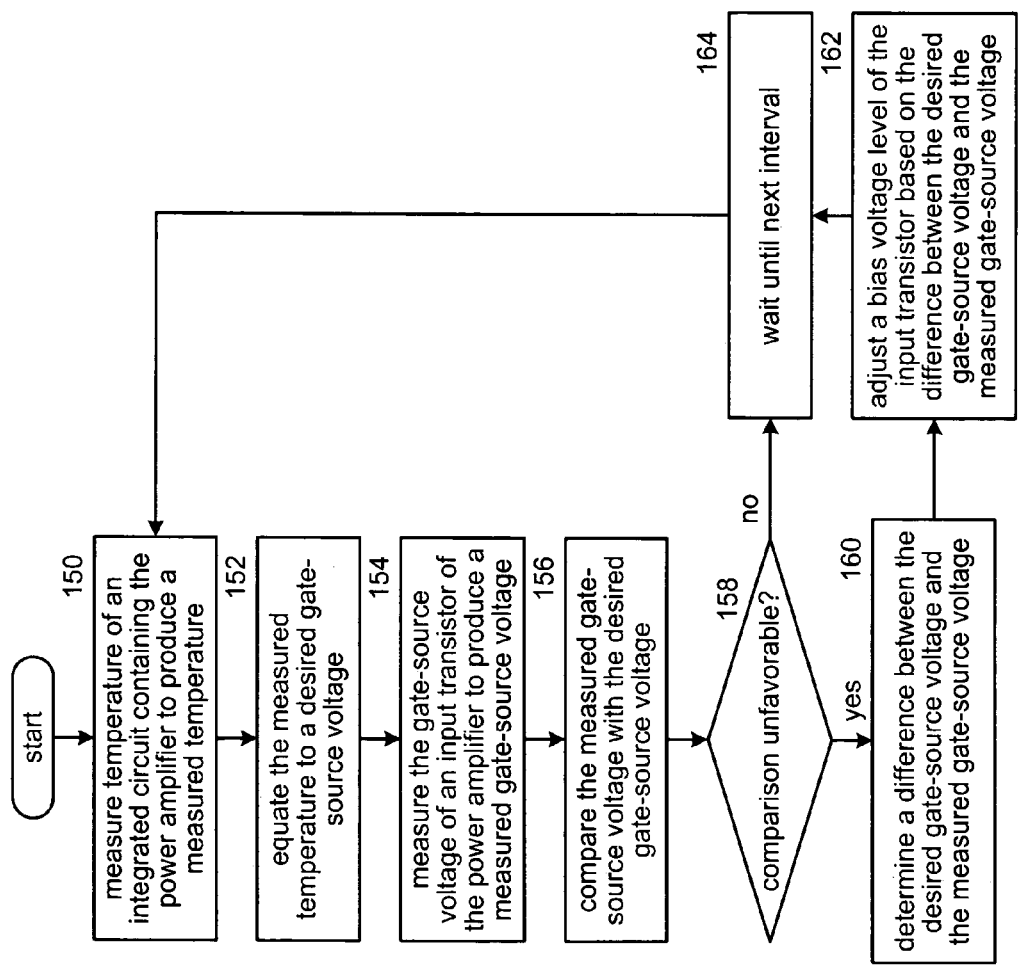
FIG. 9 is a logic diagram of a method for compensation a power amplifier based on a particular operational condition in accordance with the present invention.

FIG. 9 is a logic diagram of a method for method for compensation a power amplifier based on a particular operational condition that begins at step 150 where the calibration module measures temperature of an integrated circuit containing the power amplifier to produce a measured temperature. The method continues at step 152 where the calibration module equates the measured temperature to a desired gate-source voltage. The method continues at step 154 where the calibration module measures the gate-source voltage of an input transistor of the power amplifier to produce a measured gate-source voltage. The method continues at step 156 where the calibration module compares the measured gate-source voltage with the desired gate-source voltage.

The method continues at step 158 where the method branches depending on whether the comparison of step 156 was favorable. When comparison was favorable, the method continues at step 164 where the calibration module waits to take another measurement until the next interval. If the comparison was unfavorable, the method continues at step 160 where the calibration module determines a difference between the desired gate-source voltage and the measured gate-source voltage. The method continues at step 162 where the calibration module adjusts a bias voltage level of the input transistor based on the difference between the desired gate-source voltage and the measured gate-source voltage.

FIG. 10 is a logic diagram of a method for compensation a power amplifier based on another particular operational condition. The method begins at step 170 where the calibration module measures a peak level of an input voltage to the power amplifier to produce a measured peak input level. The method continues at step 172 where the calibration module compares the measured peak input level with a desired peak input level. The method continues at step 174 where the method branches depending on whether the comparison of step 172 was favorable. When the comparison was favorable, the method proceeds to step 180 where the calibration module waits until the next interval to take another measurement.

When the comparison was unfavorable, the method continues at step 176 where the calibration module determines a difference between the measured peak input level and the desired peak input level. The method continues at step 178 where the calibration module adjusts gain of the power amplifier based on the difference between the measured peak input level and the desired peak input level. The adjustment may be made by adjusting the capacitance of the gain adjust module 100 and/or the capacitance of the gain adjust module 104.

FIG. 11 is a logic diagram of a method for compensation a power amplifier based on yet another particular operational condition that begins at step 190 where the calibration module measures a peak level of an output voltage to the power amplifier to produce a measured peak output level. The method continues at step 192 where the calibration module compares the measured peak output level with a desired peak output level. The method continues at step 194 where the method branches depending on whether the comparison of step 12 was favorable. When the comparison was favorable, the method proceeds to step 200 where the calibration module waits until the next interval to take another measurement.

When the comparison was unfavorable, the method continues at step 196 where the calibration module determines a difference between the measured peak input level and the desired peak input level. The method continues at step 198 where the calibration module adjusts transmit power of the power amplifier based on the difference between the measured peak output level and the desired peak output level. This may be done by enabling one or more of switches S1-S4 of FIG. 7.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented various embodiments of an adjustable power amplifier that can maintain linearity over varying operational conditions while reducing power consumption. As one of average skill in the art, other embodiments may be derived from the teachings of the present invention without deviating from the scope of the claims.

What is claimed is:

1. An adjustable power amplifier comprises:
   an adjustable input capacitor section having an input connection, an output connection, and a ground connection, wherein the input connection of the adjustable input capacitor section is operably coupled to receive an input radio frequency (RF) signal and the ground connection of the adjustable input capacitor section is operably coupled to a circuit ground;
   an adjustable input transistor section having an input connection, an output connection, and a source connection, wherein the input connection of the adjustable input transistor section is operably coupled to the output connection of the adjustable input capacitor section and the source connection of the adjustable input transistor section is operably coupled to the circuit ground;
   an inductor having a first node and a second node, wherein the first node of the inductor is operably coupled to a power supply and the second node of the inductor is operably coupled to the output connection of the adjustable input transistor section to provide an output of the adjustable power amplifier;
   an adjustable bias voltage circuit operably coupled to provide a bias voltage to the input connection of the adjustable input transistor section; and
   a calibration module operably coupled to:
      measure one of a plurality of operational parameters of the power amplifier to produce a measured operational parameter;
      compare the measured operational parameter with a corresponding one of a plurality of desired operational parameter settings;
      when the comparing of the measured operational parameter with the corresponding one of a plurality of desired operational parameter settings is unfavorable, determine a difference between the measured operational parameter and the corresponding one of a plurality of desired operational parameter settings; and
      calibrate at least one of the adjustable input capacitor section, the adjustable input transistor section, and the adjustable bias voltage circuit based on the difference.

2. The adjustable power amplifier of claim 1, wherein the calibration module comprises:
   an input peak detector operably coupled to measure a peak level of the input RF signal to produce a measured peak input level;
   an analog to digital converter operably coupled to convert the measured peak input level into a digital measured peak input level; and
   adjustment module operably coupled to determine an adjustment signal for the adjustable input capacitor section based on a difference between the digital measured peak input level and a desired peak input level.

3. The adjustable power amplifier of claim 2, wherein the adjustable input capacitor circuit comprises:
   an input capacitor having a first plate and a second plate, wherein the first plate is operably coupled to receive the input RF signal and the second plate is operably coupled to the input connection of the adjustable input transistor section; and
   an adjustable capacitor circuit having a first node and a second node, wherein the first node of the adjustable capacitor circuit is operably coupled to the first plate of the input capacitor and the second node of the adjustable capacitor circuit is operably coupled to the circuit ground, wherein the adjustable capacitor circuit provides one of a plurality of capacitance values based on the difference between the digital measured peak input level and the desired peak input level.

4. The adjustable power amplifier of claim 1, wherein the calibration module comprises:
   an output peak detector operably coupled to measure a peak level of an output signal of the adjustable power amplifier to produce a measured peak output level;
   an analog to digital converter operably coupled to convert the measured peak output level into a digital measured peak output level; and
   adjustment module operably coupled to determine an adjustment signal for the adjustable input transistor section based on a difference between the digital measured peak output level and a desired peak output level.

5. The adjustable power amplifier of claim 4, wherein the adjustable input transistor section comprises:
   a plurality of input transistors, wherein each of the plurality of input transistors includes a gate, a drain, and a source, wherein the gates of the plurality of input transistors are coupled together to provide the input connection of the adjustable input transistor section and the sources of the plurality of input transistors are operably coupled together to provide the source connection; and
   a plurality of switches, wherein each of the switches includes a first node and a second node, wherein the first node of the plurality of switches are operably coupled together to provide the output connection of the adjustable input transistor section, wherein the second node of each of the plurality of switches is operably coupled to the drain of a corresponding one of the plurality of input transistors, and wherein the plurality of switches are activated based on the difference between the digital measured peak output level and the desired peak output level.

6. The adjustable power amplifier of claim 1, wherein the calibration module comprises:
   a resistor having a first node and a second node, wherein the first node of the resistor is operably coupled to the input connection of the adjustable input transistor section;
   an analog to digital converter operably coupled to the second node of the resistor, wherein the analog to digital converter converts an analog voltage at the input connection of the adjustable input transistor section into a digital value;

determination module operably coupled to determine a desired gate-source voltage based on a temperature of an integrated circuit containing the adjustable power amplifier; and adjustment module operably coupled to determine an adjustment signal for the adjustable bias circuit based on a difference between the digital value and the desired gate-source voltage.

7. The adjustable power amplifier of claim 6, wherein the adjustable bias voltage circuit comprises:

a reference transistor having a gate, a drain, and a source, wherein the source of the reference transistor is operably coupled to the circuit ground and the gate of the reference transistor is operably coupled to the provide the bias voltage;

a plurality of current sources, wherein each of the plurality of current sources includes a first node and a second node, wherein the first nodes of the plurality of current sources are operably coupled to the power supply; and a plurality of switches, wherein each of the plurality of switches includes a first node and a second node, wherein the second nodes of the plurality of switches are operably coupled to the drain of the reference transistor wherein the first node of each of the plurality of switches is operably coupled to the second node of a corresponding one of the plurality of switches, and wherein the plurality of switches are activated based on the difference between the digital value and the desired gate-source voltage.

8. The adjustable power amplifier of claim 1 further comprises:

an adjustable output capacitor section having an input connection, an output connection, and a ground connection, wherein the input connection of the adjustable output capacitor section is operably coupled to the second node of the inductor, the ground connection is operably coupled to the circuit ground, and the output connection of the adjustable output capacitor section provides an AC coupled output of the adjustable power amplifier.

9. The adjustable power amplifier of claim 8, wherein the calibration module comprises:

a peak detector operably coupled to measure a peak level of the input RF signal and a peak level of the AC coupled output of the adjustable power amplifier to produce a measured peak levels;

an analog to digital converter operably coupled to convert the measured peak levels into digital measured peak levels; and adjustment module operably coupled to determine an adjustment signal for the adjustable output capacitor section based on a difference between the digital measured peak levels and desired peak levels.

10. The adjustable power amplifier of claim 9, wherein the adjustable output capacitor circuit comprises:

an output capacitor having a first plate and a second plate, wherein the first plate is operably coupled to second node of the inductor and the second plate of the output capacitor provides the AC coupled output of the adjustable power amplifier; and an adjustable capacitor circuit having a first node and a second node, wherein the first node of the adjustable capacitor circuit is operably coupled to the second plate of the output capacitor and the second node of the adjustable capacitor circuit is operably coupled to the circuit ground, wherein the adjustable capacitor circuit provides one of a plurality of capacitance values based on the difference between the digital measured peak levels and the desired peak levels.

11. A radio comprises:

a receiver section operably coupled to convert inbound radio frequency (RF) signals into inbound baseband signals; and a transmitter section operably coupled to convert outbound baseband signals into outbound RF signals, wherein the transmitter section includes:

an adjustable power amplifier including:

an adjustable input capacitor section having an input connection, an output connection, and a ground connection, wherein the input connection of the adjustable input capacitor section is operably coupled to receive an input radio frequency (RF) signal and the ground connection of the adjustable input capacitor section is operably coupled to a circuit ground;

an adjustable input transistor section having an input connection, an output connection, and a source connection, wherein the input connection of the adjustable input transistor second is operably coupled to the output connection of the adjustable input capacitor section and the source connection of the adjustable input transistor section is operably coupled to the circuit ground;

an inductor having a first node and a second node, wherein the first node of the inductor is operably coupled to a power supply and the second node of the inductor is operably coupled to the output connection of the adjustable input transistor section to provide an output of the adjustable power amplifier;

an adjustable bias voltage circuit operably coupled to provide a bias voltage to the input connection of the adjustable input transistor section; and a calibration module operably coupled to:

measure one of a plurality of operational parameters of the power amplifier to produce a measured operational parameter;

compare the measured operational parameter with a corresponding one of a plurality of desired operational parameter settings;

when the comparing of the measured operational parameter with the corresponding one of a plurality of desired operational parameter settings is unfavorable, determine a difference between the measured operational parameter and the corresponding one of a plurality of desired operational parameter settings; and calibrate at least one of the adjustable input capacitor section, the adjustable input transistor section, and the adjustable bias voltage circuit based on the difference.

12. The radio of claim 11, wherein the calibration module comprises:

an input peak detector operably coupled to measure a peak level of the input RF signal to produce a measured peak input level;

an analog to digital converter operably coupled to convert the measured peak input level into a digital measured peak input level; and adjustment module operably coupled to determine an adjustment signal for the adjustable input capacitor section based on a difference between the digital measured peak input level and a desired peak input level.

13. The radio of claim 12, wherein the adjustable input capacitor circuit comprises:

an input capacitor having a first plate and a second plate, wherein the first plate is operably coupled to receive the input RF signal and the second plate is operably coupled to the input connection of the adjustable input transistor section; and an adjustable capacitor circuit having a first node and a second node, wherein the first node of the adjustable capacitor circuit is operably coupled to the first plate of the input capacitor and the second node of the adjustable capacitor circuit is operably coupled to the circuit ground, wherein the adjustable capacitor circuit provides one of a plurality of capacitance values based on the difference between the digital measured peak input level and the desired peak input level.

14. The radio of claim 11, wherein the calibration module comprises:

an output peak detector operably coupled to measure a peak level of an output signal of the adjustable power amplifier to produce a measured peak output level;

an analog to digital converter operably coupled to convert the measured peak output level into a digital measured peak output level; and adjustment module operably coupled to determine an adjustment signal for the adjustable input transistor section based on a difference between the digital measured peak output level and a desired peak output level.

15. The radio of claim 14, wherein the adjustable input transistor section comprises:

a plurality of input transistors, wherein each of the plurality of input transistors includes a gate, a drain, and a source, wherein the gates of the plurality of input transistors are coupled together to provide the input connection of the adjustable input transistor section and the sources of the plurality of input transistors are operably coupled together to provide the source connection; and a plurality of switches, wherein each of the switches includes a first node and a second node, wherein the first node of the plurality of switches are operably coupled together to provide the output connection of the adjustable input transistor section, wherein the second node of each of the plurality of switches is operably coupled to the drain of a corresponding one of the plurality of input transistors, and wherein the plurality of switches are activated based on the difference between the digital measured peak output level and the desired peak output level.

16. The radio of claim 11, wherein the calibration module comprises:

a resistor having a first node and a second node, wherein the first node of the resistor is operably coupled to the input connection of the adjustable input transistor section;

an analog to digital converter operably coupled to the second node of the resistor, wherein the analog to digital converter converts an analog voltage at the input connection of the adjustable input transistor section into a digital value;

determination module operably coupled to determine a desired gate-source voltage based on a temperature of an integrated circuit containing the adjustable power amplifier; and adjustment module operably coupled to determine an adjustment signal for the adjustable bias circuit based on a difference between the digital value and the desired gate-source voltage.

17. The radio of claim 16, wherein the adjustable bias voltage circuit comprises:

a reference transistor having a gate, a drain, and a source, wherein the source of the reference transistor is operably coupled to the circuit ground and the gate of the reference transistor is operably coupled to the provide the bias voltage;

a plurality of current sources, wherein each of the plurality of current sources includes a first node and a second node, wherein the first nodes of the plurality of current sources are operably coupled to the power supply; and a plurality of switches, wherein each of the plurality of switches includes a first node and a second node, wherein the second nodes of the plurality of switches are operably coupled to the drain of the reference transistor wherein the first node of each of the plurality of switches is operably coupled to the second node of a corresponding one of the plurality of switches, and wherein the plurality of switches are activated based on the difference between the digital value and the desired gate-source voltage.

18. The radio of claim 11, wherein the adjustable power amplifier further comprises:

an adjustable output capacitor section having an input connection, an output connection, and a ground connection, wherein the input connection of the adjustable output capacitor section is operably coupled to the second node of the inductor, the ground connection is operably coupled to the circuit ground, and the output connection of the adjustable output capacitor section provides an AC coupled output of the adjustable power amplifier.

19. The radio of claim 18, wherein the calibration module comprises:

a peak detector operably coupled to measure a peak level of the input RF signal and a peak level of the AC coupled output of the adjustable power amplifier to produce a measured peak levels;

an analog to digital converter operably coupled to convert the measured peak levels into digital measured peak levels; and adjustment module operably coupled to determine an adjustment signal for the adjustable output capacitor section based on a difference between the digital measured peak levels and desired peak levels.

20. The radio of claim 19, wherein the adjustable output capacitor circuit comprises:

an output capacitor having a first plate and a second plate, wherein the first plate is operably coupled to second node of the inductor and the second plate of the output capacitor provides the AC coupled output of the adjustable power amplifier; and an adjustable capacitor circuit having a first node and a second node, wherein the first node of the adjustable capacitor circuit is operably coupled to the second plate of the output capacitor and the second node of the adjustable capacitor circuit is operably coupled to the circuit ground, wherein the adjustable capacitor circuit provides one of a plurality of capacitance values based on the difference between the digital measured peak levels and the desired peak levels.

* * * * *